United States Patent
Harnik et al.

(10) Patent No.: US 9,515,679 B1
(45) Date of Patent: Dec. 6, 2016

(54) ADAPTIVE DATA COMPRESSION (71) Applicant: INTERNATIONAL BUSINESS MACHINES CORPORATION, Armonk, NY (US)

(72) Inventors: Danny Harnik, Tel Mond (IL); Ety Khaitzin, Holon (IL); Sergey Marenkov, Tel Aviv (IL); Dmitry Sotnikov, Givataim (IL)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/712,045

(22) Filed: May 14, 2015

(51) Int. Cl.
H03M 7/30 (2006.01)
H03M 7/46 (2006.01)

(52) U.S. Cl.
CPC ............. H03M 7/46 (2013.01); H03M 7/3084 (2013.01)

(58) Field of Classification Search
CPC ........... H03M 7/3084–7/3088; H03M 7/6064; H03M 7/6076; H03M 7/6082
See application file for complete search history.

(56) References Cited

U.S. PATENT DOCUMENTS

| | | | |
|---|---|---|---|
| 5,126,739 A * | 6/1992 | Whiting | H03M 7/3086 341/106 |
| 5,684,478 A | 11/1997 | Panaoussis | |
| 7,460,032 B2 | 12/2008 | Boldt et al. | |
| 7,724,974 B2 * | 5/2010 | Koziarz | H04N 1/4105 382/244 |
| 7,903,887 B2 * | 3/2011 | Sasaki | H04N 19/70 348/222.1 |
| 8,331,449 B2 | 12/2012 | Kim et al. | |
| 8,499,100 B1 | 7/2013 | Rothstein | |
| 8,750,370 B2 | 6/2014 | Nagapudi et al. | |
| 2003/0030575 A1 * | 2/2003 | Frachtenberg | H03M 7/3088 341/51 |
| 2011/0310955 A1 | 12/2011 | Zhang | |

OTHER PUBLICATIONS

Manzini et al, A Simple and Fast DNA Compressor, Feb. 17, 2004, pp. 1-15, Software—Practice and Experience, 2004, vol. 34, No. 14, pp. 1397-1411.

* cited by examiner

Primary Examiner — Howard Williams
(74) Attorney, Agent, or Firm — Griffiths & Seaton PLLC (57) ABSTRACT Methods, computing systems and computer program products implement embodiments of the present invention that include accessing, from a sequence of multiple data segments including a first data segment at a first location in the sequence followed by additional data segments having respective additional locations in the sequence, a current given data segment in the sequence. In some embodiments, data to be compressed is received and partitioned into the multiple data segments. The current data segment is compressed the current data segment using a first minimal match length, and a compression ratio is calculated for the compressed current data segment. Based on the compression ratio and the respective location of the current data segment, a second minimal match length is selected, a subsequent data segment that immediately follows the current data segment in the sequence is accessed, and the subsequent data segment is compressed using the second minimal match length.

16 Claims, 3 Drawing Sheets

ADAPTIVE DATA COMPRESSION

FIELD OF THE INVENTION

The present invention relates generally to data compression, and specifically to optimizing minimal repetition sizes while compressing data.

BACKGROUND

There are typically tradeoffs between time and space when compressing data. Therefore, as long as data is compressible, more time can be invested in order to improve the compression and thereby saving more space. Many compression algorithms typically have several modes, ranging between fast and slow, with corresponding compression results.

One commonly used compression method is the Lempel-Ziv 77 factorization. One technique utilized by the Lempel-Ziv 77 factorization is replacing a long repetition with a short pointer in order to save space. The longer the repetition, the more space can be saved by replacing it with a pointer. In operation, the effort invested in finding the longest possible repetition is one of the major variables in the time vs. space tradeoff described supra. For example, higher levels of compression typically allocate more resources towards finding longer repetitions.

The description above is presented as a general overview of related art in this field and should not be construed as an admission that any of the information it contains constitutes prior art against the present patent application.

SUMMARY

There is provided, in accordance with an embodiment of the present invention a method, including accessing, from a sequence of multiple data segments including a first data segment at a first location in the sequence followed by additional data segments having respective additional locations in the sequence, a current given data segment in the sequence, compressing the current data segment using a first minimal match length, calculating a compression ratio for the compressed current data segment, selecting, based on the compression ratio and the respective location of the current data segment, a second minimal match length, accessing a subsequent data segment that immediately follows the current data segment in the sequence, and compressing the subsequent data segment using the second minimal match length.

There is also provided, in accordance with an embodiment of the present invention an apparatus, including a memory configured to store a sequence of multiple data segments including a first data segment at a first location in the sequence followed by additional data segments having respective additional locations in the sequence, and a processor configured to access a current data segment in the sequence, to compress the current data segment using a first minimal match length, to calculate a compression ratio for the compressed current data segment, to select, based on the compression ratio and the respective location of the current data segment, a second minimal match length, to access a subsequent data segment that immediately follows the current data segment in the sequence, and to compress the subsequent data segment using the second minimal match length.

There is further provided, in accordance with an embodiment of the present invention a computer program product, the computer program product including a non-transitory computer readable storage medium having computer readable program code embodied therewith, the computer readable program code including computer readable program code configured to access, from a sequence of multiple data segments including a first data segment at a first location in the sequence followed by additional data segments having respective additional locations in the sequence, a current given data segment in the sequence, computer readable program code configured to compress the current data segment using a first minimal match length, computer readable program code configured to calculate a compression ratio for the compressed current data segment, computer readable program code configured to select, based on the compression ratio and the respective location of the current data segment, a second minimal match length, computer readable program code configured to access a subsequent data segment that immediately follows the current data segment in the sequence, and computer readable program code configured to compress the subsequent data segment using the second minimal match length.

BRIEF DESCRIPTION OF THE DRAWINGS

The disclosure is herein described, by way of example only, with reference to the accompanying drawings, wherein.

DETAILED DESCRIPTION OF EMBODIMENTS

Overview

Prior to compressing data, compression systems can be initialized by setting a minimum length of repetition. For example if the minimal repetition is eight, the compression system will look for strings of at least eight characters that occur multiple times in the data. When compressing the data, using the correct minimum repetition length can have a significant impact on the compression ratio for the data.

Embodiments of the present invention provide methods and systems for improving both compression speeds and compression ratios by adaptively increasing and reducing the minimal length of repetition during data compression. When compressing data having many long repetitions, systems implementing embodiments of the invention can find long repetitions instead of finding shorter repetitions, thereby increasing the overall compression ratio of the data. In some embodiments, if the system fails to identify any long repetitions in the data, the system can then look for shorter repetitions.

As described hereinbelow, upon receiving data to be compressed, the data can be partitioned into a sequence of multiple segments (also referred to herein as data segments) comprising a first data segment followed by one or more additional data segments. In embodiments of the present invention, the minimal match length value used to compress each of the data segments can be determined based on the minimal match lengths and compression ratios of previous segments. In operation, the first segment in the sequence is compressed using a default minimal match length, a compression ratio is calculated, and the next data segment in the sequence can then be compressed using a minimal match length that is selected based on the first segment's compression ratio and the minimal match length that was used to compress the first segment. In a similar manner, the minimal match length for each of the additional data segments is selected, until all the data is compressed.

While compressing data, systems implementing embodiments of the present invention can periodically evaluate and change the minimal repetition length, thereby optimizing the compression ratio for the data, without compromising for data that predominantly contains long/short repetition lengths. The adaptive control process of evaluating and changing the minimal repetition length requires very little resources and hence may have little effect on the compression performance. Additionally, when longer repetitions are found, both the compression speed and the decompression speed may actually improve dramatically.

Figure 1:
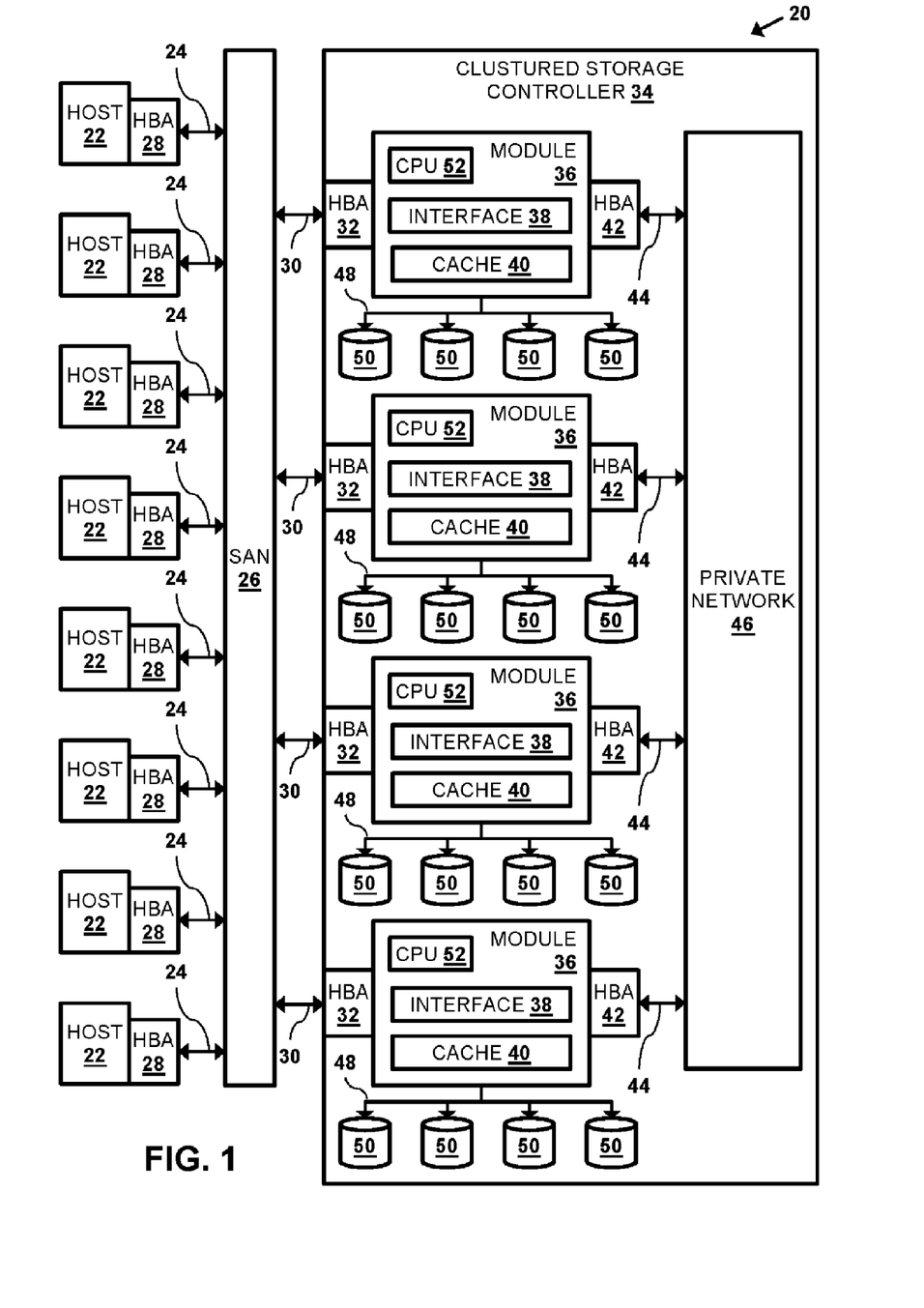
FIG. 1 is a block diagram that schematically illustrates a storage system comprising a storage controller, in accordance with an embodiment of the present invention.

FIG. 1 is a block diagram that schematically illustrates a data processing storage subsystem 20, in accordance with an embodiment of the invention. The particular subsystem (also referred to herein as a storage system) shown in FIG. 1 is presented to facilitate an explanation of the invention. However, as the skilled artisan will appreciate, the invention can be practiced using other computing environments, such as other storage subsystems with diverse architectures and capabilities. For example, the adaptive compression approach described herein can be implemented and used with any type of physical or software defined storage system.

Storage subsystem 20 receives, from one or more host computers 22, input/output (I/O) requests, which are commands to read or write data at logical addresses on logical volumes. Any number of host computers 22 are coupled to storage subsystem 20 by any means known in the art, for example, using a network. Herein, by way of example, host computers 22 and storage subsystem 20 are assumed to be coupled by a Storage Area Network (SAN) 26 incorporating data connections 24 and Host Bus Adapters (HBAs) 28. The logical addresses specify a range of data blocks within a logical volume, each block herein being assumed by way of example to contain 512 bytes. For example, a 10 KB data record used in a data processing application on a given host computer 22 would require 20 blocks, which the given host computer might specify as being stored at a logical address comprising blocks 1,000 through 1,019 of a logical volume. Storage subsystem 20 may operate in, or as, a SAN system.

Storage subsystem 20 comprises a clustered storage controller 34 coupled between SAN 26 and a private network 46 using data connections 30 and 44, respectively, and incorporating adapters 32 and 42, again respectively. In some configurations, adapters 32 and 42 may comprise host bus adapters (HBAs). Clustered storage controller 34 implements clusters of storage modules 36, each of which includes a processor 52, an interface 38 (in communication between adapters and 42), and a cache 40. Each storage module 36 is responsible for a number of storage devices 50 by way of a data connection 48 as shown.

As described previously, each storage module 36 further comprises a given cache 40. However, it will be appreciated that the number of caches 40 used in storage subsystem 20 and in conjunction with clustered storage controller 34 may be any convenient number. While all caches 40 in storage subsystem 20 may operate in substantially the same manner and comprise substantially similar elements, this is not a requirement. Each of the caches 40 may be approximately equal in size and is assumed to be coupled, by way of example, in a one-to-one correspondence with a set of physical storage devices 50, which may comprise disks. In one embodiment, physical storage devices may comprise such disks. Those skilled in the art will be able to adapt the description herein to caches of different sizes.

Each set of storage devices 50 comprises multiple slow and/or fast access time mass storage devices, herein below assumed to be multiple hard disks. FIG. 1 shows caches 40 coupled to respective sets of storage devices 50. In some configurations, the sets of storage devices 50 comprise one or more hard disks, or solid state drives (SSDs) which can have different performance characteristics. In response to an I/O command, a given cache 40, by way of example, may read or write data at addressable physical locations of a given storage device 50. In the embodiment shown in FIG. 1, caches 40 are able to exercise certain control functions over storage devices 50. These control functions may alternatively be realized by hardware devices such as disk controllers (not shown), which are linked to caches 40.

Each storage module 36 is operative to monitor its state, including the states of associated caches 40, and to transmit configuration information to other components of storage subsystem 20 for example, configuration changes that result in blocking intervals, or limit the rate at which I/O requests for the sets of physical storage are accepted.

Routing of commands and data from HBAs 28 to clustered storage controller 34 and to each cache 40 may be performed over a network and/or a switch. Herein, by way of example, HBAs 28 may be coupled to storage modules 36 by at least one switch (not shown) of SAN 26, which can be of any known type having a digital cross-connect function. Additionally or alternatively, HBAs 28 may be coupled to storage modules 36.

In some embodiments, data having contiguous logical addresses can be distributed among modules 36, and within the storage devices in each of the modules. Alternatively, the data can be distributed using other algorithms, e.g., byte or block interleaving. In general, this increases bandwidth, for instance, by allowing a volume in a SAN or a file in network attached storage to be read from or written to more than one given storage device 50 at a time. However, this technique requires coordination among the various storage devices, and in practice may require complex provisions for any failure of the storage devices, and a strategy for dealing with error checking information, e.g., a technique for storing parity information relating to distributed data. Indeed, when logical unit partitions are distributed in sufficiently small granularity, data associated with a single logical unit may span all of the storage devices 50.

While such hardware is not explicitly shown for purposes of illustrative simplicity, clustered storage controller 34 may be adapted for implementation in conjunction with certain hardware, such as a rack mount system, a midplane, and/or a backplane. Indeed, private network 46 in one embodiment may be implemented using a backplane. Additional hardware such as the aforementioned switches, processors, controllers, memory devices, and the like may also be incorporated into clustered storage controller 34 and elsewhere within storage subsystem 20, again as the skilled artisan will appreciate. Further, a variety of software components, operating systems, firmware, and the like may be integrated into one storage subsystem 20.

Storage devices 50 may comprise a combination of high capacity hard disk drives and solid state disk drives. In some embodiments each of storage devices 50 may comprise a logical storage device. In storage systems implementing the Small Computer System Interface (SCSI) protocol, the logical storage devices may be referred to as logical units, or LUNs. While each LUN can be addressed as a single logical unit, the LUN may comprise a combination of high capacity hard disk drives and/or solid state disk drives.

While the configuration in FIG. 1 shows storage controller 34 comprising four modules 36 and each of the modules coupled to four storage devices 50, a given storage controller comprising any multiple of modules 36 coupled to any plurality of storage devices 50 is considered to be with the spirit and scope of the present invention.

Figure 2:
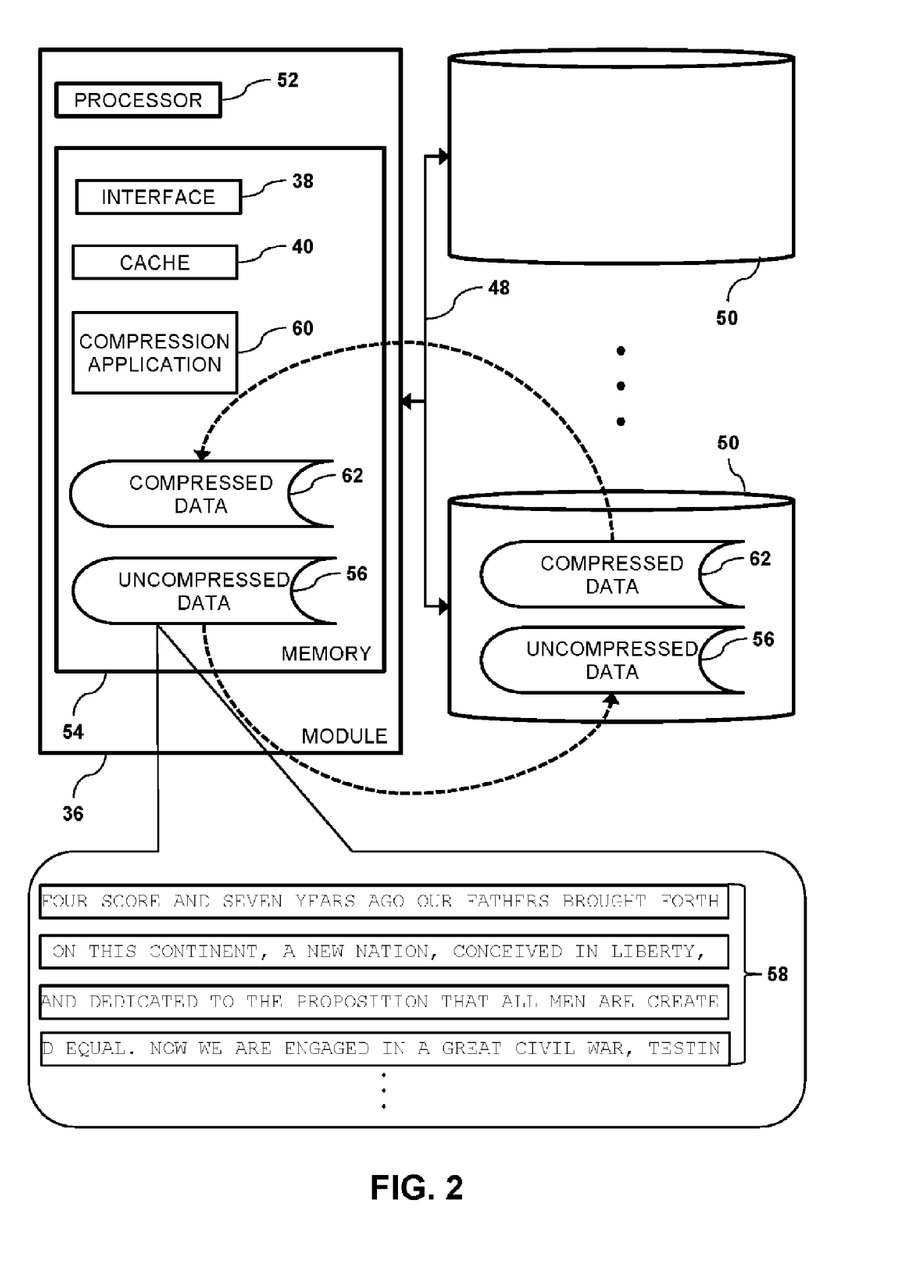
FIG. 2 is a block diagram that schematically illustrates a module of the storage controller configured to perform adaptive control data compression, in accordance with an embodiment of the present invention.

FIG. 2 is a block diagram that schematically illustrates components of module 36, in accordance with an embodiment of the present invention. In addition to storage devices 50 and processor 52, module 36 comprises a memory 54. In operation, processor 52 is configured to retrieve uncompressed data 56 from a given storage device 50, store the uncompressed data to memory 54, and segment the uncompressed data into multiple data segments 58. Processor 52 executes a compression application 60 (i.e., a compression engine) that is configured to compress segments 58 by selecting the best minimal repetition length for the segments. The functionality of processor 52 executing compression application 60 is described in detail in the description referencing FIG. 3 hereinbelow. Upon compressing uncompressed data 56 to compressed data 62 in memory 54, processor 52 can store the compressed data to the given storage device.

While the example in FIG. 2 shows segments 58 having a length of 56 characters for illustrative purposes, segment lengths of any lengths are considered to be within the spirit and scope of the present invention. In operation, the segment length is typically much longer (e.g., 64 KB). Additionally, while the configuration in FIG. 2 shows compression application 60 executing on module 36, executing the compression application on any other type of computing device is considered to be within the spirit and scope of the present invention.

Furthermore, while the configuration in FIG. 2 shows processor retrieving uncompressed data 56 from a given storage device 50 and storing compressed data 62 to the given storage device, processor 52 receiving the uncompressed data from another data source, and conveying the compressed data to another data destination is considered to be within the spirit and scope of the present invention. For example, the data source and/or the data destination may comprise a computing device (e.g., a given host computer 22) coupled to module 36 via a computer network such as SAN 26, a local area network (not shown) and a wide area network (not shown).

Processor 52 comprises a general-purpose central processing unit (CPU) or special-purpose embedded processors, which are programmed in software or firmware to carry out the functions described herein. For example, the logic and functionality of compression application 60 may implemented as a field programmable gate array (FPGA). The software may be downloaded to modules 36 in electronic form, over a network, for example, or it may be provided on non-transitory tangible media, such as optical, magnetic or electronic memory media. Alternatively, some or all of the functions of the processor may be carried out by dedicated or programmable digital hardware components, or using a combination of hardware and software elements.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Identifying Optimal Minimal Match Lengths

Figure 3:
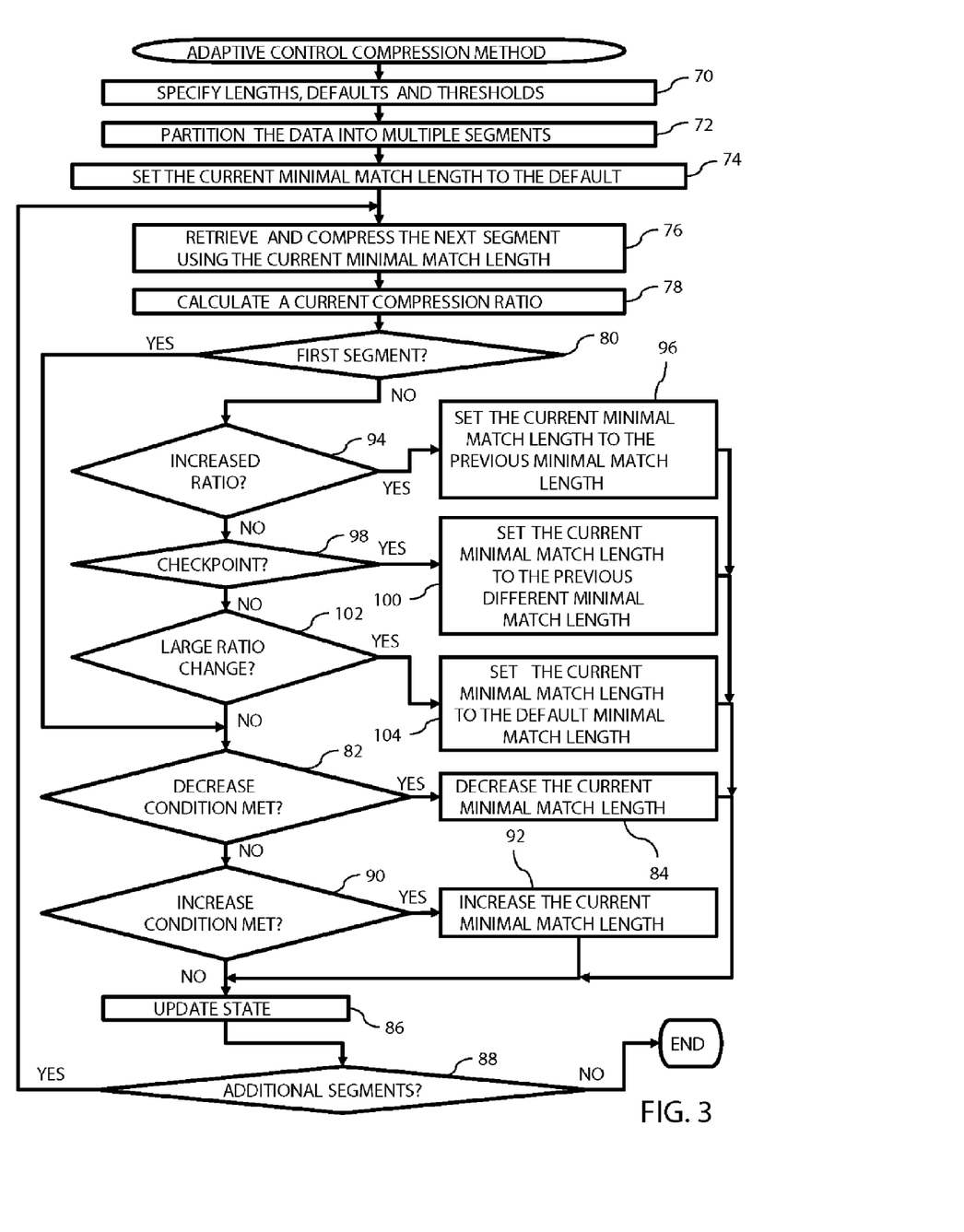
FIG. 3 is a flow diagram that schematically illustrates a method of performing adaptive control data compression, in accordance with a first embodiment of the preset invention.

FIG. 3 is a flow diagram that schematically illustrates an adaptive control method for compressing data 56, in accordance with a first embodiment of the preset invention. In a first initialization step 70, the following parameters are defined and specified: (a) a segment length, (b) one or more monitoring checkpoints, (c) a set of minimal match lengths that includes a default minimal match length, (d) a low compression threshold, (e) a high compression threshold, (f) an increase change limit, (g) a decrease change limit, (h) a maximum change threshold, and (i) a sensitivity threshold σ. Use of the parameters initialized in step 70 is described hereinbelow. The initial parameters would be received as input from a user, or would be set by using some default predefined parameters that would be stored as file or even hardcoded as part of implementation.

In embodiments herein, each data segment 58 may be referenced by an index (A), where A is a number representing a given segment 58. For example, if the uncompressed data is 64 MB and the segment length is 64 KB, then compression application 60 can split data 56 into 1024 segments so that the segments comprise segments 58(1)-58 (1,024). In some embodiments, compression application 60 can identify each Nth segment 58 as a monitoring checkpoint. For example, if N=1000, then the monitoring checkpoints comprise segment 58(1000), segment 58(2000), segment 58 (3000) etc.

In a partition step 72, compression application 60 splits (i.e., partitions) data 62 into multiple segments 58, by using the specified segment length (e.g., 64 KB), and in a second initialization step 74, the compression application sets a current minimal match length to the default minimal match length. In a retrieval and compression step 76, the compression engine retrieves (i.e., accesses) the next segment 58, and compresses the retrieved segment using the current minimal match length.

In embodiments of the present invention, segments 58 comprise a sequence of multiple data segments 58 comprising a first data segment (i.e., segment 58(1)) at a first location in the sequence that is followed by additional data segments (i.e., segment 58(2)-segment 58(n)) having respective additional locations in the sequence. While step 72 describes processor 52 partitioning data 62 into multiple segments, other methods of retrieving the segments in the sequence are considered to be within the spirit and scope of the present invention. For example, processor 52 can receive each segment 58 sequentially from a computer network (e.g., a LAN or WAN).

In a calculation step 78, the compression application calculates a compression ratio for the compressed segment. In embodiments described herein, the compression ratio comprises the size of the compressed retrieved segment divided by the size of the original (i.e., uncompressed) segment. Therefore, lower compression ratios indicate greater space savings than higher compression ratios.

In a first comparison step 80 if the retrieved segment comprises the data segment 58(1) (i.e., the first data segment), then in a second comparison step 82, compression application 60 checks if a decrease condition has been met. In some embodiments, the decrease condition comprises checking if (a) a given minimal match size is available (i.e., in the set of minimal match lengths) that is less than the current minimal match length, (b) the calculated compression ratio is greater than the low compression threshold (i.e., the calculated compression ratio is worse than the low compression threshold), and (c) the decrease change limit has not yet been reached. For example, the decrease condition can be met if (a) the set of minimal match lengths is {3, 4, 6, 8, 16} and the current minimal match size is 4, (b) the low compression ratio is 0.25 and the current compression ratio is 0.3, and (c) the decrease change limit is 5 and there has already been 2 decreases to the minimal match length while compressing the uncompressed data.

If the decrease condition has been met, then compression application 60 decreases the current minimal match length in a decrease step 84. For example if the current minimal match length is 4 and the set of minimal match lengths is {3, 4, 6, 8, 16}, then compression application 60 decreases the current minimal match length to 3.

In an update step 86, compression application 60 updates the status of compression application 60 by updating any parameters that have changed. For example, if the calculated compression ratio is 0.3, the compression application decreased the current minimal match length from 4 to 3, and there was previously 1 minimal match length decreases, then compression application 60 updates the status parameters by setting the previous compression ratio to 0.3, setting the previous minimal match length to 4, and increasing the number of minimal match decreases to 2. In operation, compression application 60 uses these status parameters when compressing one or more additional segments 58.

In a third comparison step 88, if there are additional segments 58 to be compressed, then the method continues with step 76. However, if there are no additional segments 58 to be compressed, then all data 56 has been compressed, and the method ends.

Returning to step 82, if the decrease condition has not been met, then in a fourth comparison step 90, compression application 60 checks if an increase condition has been met. In some embodiments, the increase condition comprises checking if (a) a given minimal match size is available (i.e., in the set of minimal match lengths) that is greater than the current minimal match length, (b) the calculated compression ratio is less than the high compression threshold (i.e., the calculated compression ratio is better than the high compression threshold), and (c) the increase change limit has not yet been reached. For example, the increase condition can be met if (a) the set of minimal match lengths is {3, 4, 6, 8, 16} and the current minimal match size is 6, (b) the high compression ratio is 0.25 and the current compression ratio is 0.2, and (c) the increase change limit is 5 and there has already been 4 increases to the minimal match length while compressing data 56.

If the increase condition is met, then compression application 60 increases the current minimal match length in an increase step 90, and the method continues with step 92. For example if the current minimal match length is 4 and the set of minimal match lengths is {3, 4, 6, 8, 16}, then compression application 60 increases the current minimal match length to 6. However if the increase condition is not met in step 90, then the method continues with step 86.

Returning to step 80, if the segment retrieved in step 76 is not the first segment in data 62, then in a fifth comparison step 94, compression application 60 checks if the compression ratio has increased. In some embodiments, compression application 60 can use sensitivity threshold σ to determine if the compression ratio has increased. For example if σ=0.1, the compression ratio for segment 58(10) was 0.3 and after compressing segment 58(11), compression application 60 calculates the compression ratio for segment 58(11) to be 0.38, then the compression ratio is not considered to have increased. Likewise, if σ=0.1, the compression ratio for segment 58(10) was 0.3 and after compressing segment 58(11), compression application 60 calculates the compression ratio for segment 58(11) to be 0.45, then the compression ratio is considered to have increased.

If the compression ratio has increased, then in a first set step 96, compression application 60 sets the current minimal match length to the previous minimal match length, and the method continues with step 86. For example, if compression application 60 has compressed segments 58(1)-58(9), then compression application 60 sets the current minimal match length to the previous minimal match length by setting the current minimal match length to the minimal match length that was used to compress segment 58(8) (i.e., the data segment that immediately precedes the retrieved data segment in the sequence). In embodiments of the present invention, compression application 60 uses the current minimal match length to compress the next segment (i.e., segment 58(10)). The minimal match length compression application 60 used to compress segment 58(8) (i.e., the previous minimal match length) may or may not be the same minimal match length that was used to compress segment 58(9). Therefore, setting the current minimal match length to the previous minimal match length may or may not change the current minimal match length.

Returning to step 94, if the compression ratio has not increased, then in a sixth comparison step 98 compression application 60 checks if the segment retrieved and compressed in step 76 is a monitoring checkpoint. If the retrieved segment is a monitoring checkpoint, then in a second set step 100, compression application 60 sets the current minimal match length to the previous minimal match length that is different from the minimal match length that was used to compress the retrieved segment. For example, if the retrieved segment comprises segment 58(300), and compression application 60 used a minimal match length having a length of 4 to compress segments 58(101-200) and used a minimal match length having a length of 8 to compress segments 58(201-300), then the previous minimal match length that is different from the minimal match length that was used to compress the retrieved segment is 4. In operation, processor 52 can go back from the retrieved segment (e.g., segment 58(300)), and locate the closest previously compressed segment in the sequence (e.g., segment 58(200)) that was compressed using a different minimal match length.

Returning to step 98, if the if the segment retrieved and compressed in step 76 is not a monitoring checkpoint, then in a seventh comparison step 102, compression application 60 checks if there has been a large change in the compression ratio. In some embodiments, compression application 60 can use the maximum change threshold that was set in step 70 to determine of there was a large change in the compression ratio as follows:

$$\text{If } |CR(N)-CR(N-1)| > \text{Maximum Change Threshold}$$

then there is a large change in the compression threshold where CR(N) is the compression ratio for the segment that was retrieved and compressed in step 76, and CR(N−1) is the compression ratio of the previously compressed segment 58.

For example, if the maximum change threshold is 0.2, segment 58(46) has a compression ratio of 0.5, and segment 58(47) (i.e., the segment that was most recently compressed in step 76) has a compression ratio of 0.25, then there has been a large change in the compression ratio. Likewise if the maximum change threshold is 0.2, segment 58(46) has a compression ratio of 0.5, and segment 58(47) has a compression ratio of 0.4, then there has not been a large change in the compression ratio.

If there has been a large change in the compression ratio, then in a third set step 104, compression application 60 sets the current minimal match length to the default minimal match length, and the method continues with step 86. However, if there has not been a large change in the compression ratio, then the method continues with step 82.

While performing the steps shown in the flow diagram, processor 52 can maintain a decrease change counter and an increase change counter. Processor 52 can use the decrease change counter in step 80 to determine if the decrease change limit has been reached by comparing the decrease change counter to the decrease change limit, and use the increase change counter in step 90 to determine if the increase change limit has been reached by comparing the increase change counter to the increase change limit. In operation, processor 52 increment the increase change counter upon increasing the minimal match length (i.e., in steps 92, 96, 100 and 104), and increment the decrease change counter upon decreasing the minimal match length (i.e., in steps 84, 96, 100 and 104). In some embodiments, upon setting the current minimal match length to the default minimal match length in step 104, processor 52 can decrease the appropriate increase/decrease change counter in order to avoid exceeding the respective increase/decrease change limit.

While embodiments herein describe compression application varying the minimal match length to find a given minimal match length yielding the highest compression ratio, the compression application can also test various lengths of segments 58 while compressing uncompressed data 56. For example, compression application 60 can use various combinations of minimal match lengths (e.g., three, four and eight bytes) and segments sizes (e.g., 32 KB, 64 KB and 128 KB) to find the optimal combination of minimal match length and segment size for uncompressed data 56.

In embodiments of the present invention, the data segment retrieved and compressed in step 76 may also be referred to as a current data segment, the current minimal match length used to compress the current data segment (also in step 76) may also be referred to as a first minimal match length, and the compression ratio calculated in step 78 may also be referred to as a current compression ratio. Also, the minimal match length set in steps 84, 92, 96, 100 and 104 may also be referred to herein as a second minimal match length, and the data segment subsequently compressed using the second minimal match length (i.e., by performing steps 88 and 76) may also be referred to herein as a subsequent data segment 58. Additionally, the previous minimal match length referred to in step 96 may also be referred to as a first previous minimal match length, and the data segment that precedes the current data segment in the sequence may also be referred to as a first previous data segment. Furthermore, the previous minimal match length identified in step 100 that is different from the first minimal match length may also be referred to as a second previous minimal match length, and the closest previously compressed segment in the sequence that was compressed using the second previous minimal match length may also be referred to as a second previous data segment.

The flowchart(s) and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

It will be appreciated that the embodiments described above are cited by way of example, and that the present invention is not limited to what has been particularly shown and described hereinabove. Rather, the scope of the present invention includes both combinations and subcombinations of the various features described hereinabove, as well as variations and modifications thereof which would occur to persons skilled in the art upon reading the foregoing description and which are not disclosed in the prior art.

The invention claimed is:

1. A method, comprising:
accessing, from a sequence of multiple data segments comprising a first data segment at a first location in the sequence followed by additional data segments having respective additional locations in the sequence, a current given data segment in the sequence;
compressing the current data segment using a first minimal match length;
calculating a compression ratio for the compressed current data segment;
selecting, based on the compression ratio and the respective location of the current data segment, a second minimal match length;
accessing a subsequent data segment that immediately follows the current data segment in the sequence;
compressing the subsequent data segment using the second minimal match length; and
specifying a high compression threshold, a low compression threshold, a maximum change threshold, a default minimal match length, and one or more of the respective locations as respective checkpoints;
wherein selecting the second minimal match length comprises setting the second minimal match length to a value greater than the first minimal match length upon detecting that the compression ratio is less than the low compression threshold.

2. The method according to claim 1, wherein the first minimal match length comprises the default minimal match length upon the current data segment comprising the first data segment in the sequence.

3. The method according to claim 1, wherein selecting the second minimal match length comprises setting the second minimal match length to a value less than the first minimal match length upon detecting that the compression ratio is greater than the high compression threshold.

4. The method according to claim 1, wherein the compression ratio comprises a current compression ratio, and comprising upon the current data segment not comprising the first data segment in the sequence, identifying a first previous data segment that immediately precedes the current data segment in the sequence, identifying a third minimal match length that was used to compress the first previous data segment, identifying a previous compression ratio for the first previous data segment, and identifying a second previous data segment in the sequence that was most recently compressed using a fourth minimal match length different from the first minimal match length.

5. The method according to claim 4, wherein selecting the second minimal match length comprises setting the second minimal match length to the third minimal match length upon detecting that the current compression ratio is greater than the previous compression ratio.

6. The method according to claim 4, wherein selecting the second minimal match length comprises setting the second minimal match length to the fourth minimal match length upon detecting respective location of the current data segment comprises one of the one or more checkpoints.

7. The method according to claim 4, wherein selecting the second minimal match length comprises setting the second minimal match length to the default minimal match length upon detecting that an absolute value of a difference between the first and the second compression ratios exceeds the maximum change threshold.

8. An apparatus, comprising:
a memory configured to store a sequence of multiple data segments comprising a first data segment at a first location in the sequence followed by additional data segments having respective additional locations in the sequence; and a processor configured:
to access a current data segment in the sequence,
to compress the current data segment using a first minimal match length,
to calculate a compression ratio for the compressed current data segment,
to select, based on the compression ratio and the respective location of the current data segment, a second minimal match length,
to access a subsequent data segment that immediately follows the current data segment in the sequence,
to compress the subsequent data segment using the second minimal match length, and
to specify a high compression threshold, a low compression threshold, a maximum change threshold, a default minimal match length, and one or more of the respective locations as respective checkpoints;
wherein selecting the second minimal match length comprises setting the second minimal match length to a value greater than the first minimal match length upon detecting that the compression ratio is less than the low compression threshold.

9. The apparatus according to claim 8, wherein the first minimal match length comprises the default minimal match length upon the current data segment comprising the first data segment in the sequence.

10. The apparatus according to claim 8, wherein the processor is configured to select the second minimal match length by setting the second minimal match length to a value less than the first minimal match length upon detecting that the compression ratio is greater than the high compression threshold.

11. The apparatus according to claim 8, wherein the compression ratio comprises a current compression ratio, and wherein upon the current data segment not comprising the first data segment in the sequence, the processor is configured to identify a first previous data segment that immediately precedes the current data segment in the sequence, to identify a third minimal match length that was used to compress the first previous data segment, to identify a previous compression ratio for the first previous data segment, and to identify a second previous data segment in the sequence that was most recently compressed using a fourth minimal match length different from the first minimal match length.

12. The apparatus according to claim 11, wherein the processor is configured to select the second minimal match length by setting the second minimal match length to the third minimal match length upon detecting that the current compression ratio is greater than the previous compression ratio.

13. The apparatus according to claim 11, wherein the processor is configured to select the second minimal match length by setting the second minimal match length to the fourth minimal match length upon detecting respective location of the current data segment comprises one of the one or more checkpoints.

14. The apparatus according to claim 11, wherein the processor is configured to select the second minimal match length by setting the second minimal match length to the default minimal match length upon detecting that an absolute value of a difference between the first and the second compression ratios exceeds the maximum change threshold.

15. The apparatus according to claim 8, wherein prior to storing the sequence of the multiple data segments in the memory, the processor is configured to receive the multiple data segments from a data source selected from a group consisting of a storage device and a computer network.

16. A computer program product, the computer program product comprising:
a non-transitory computer readable storage medium having computer readable program code embodied therewith, the computer readable program code comprising:
computer readable program code configured to access, from a sequence of multiple data segments comprising a first data segment at a first location in the sequence followed by additional data segments having respective additional locations in the sequence, a current given data segment in the sequence;
computer readable program code configured to compress the current data segment using a first minimal match length;
computer readable program code configured to calculate a compression ratio for the compressed current data segment;
computer readable program code configured to select, based on the compression ratio and the respective location of the current data segment, a second minimal match length;
computer readable program code configured to access a subsequent data segment that immediately follows the current data segment in the sequence;
computer readable program code configured to compress the subsequent data segment using the second minimal match length; and
computer readable program code configured to specify a high compression threshold, a low compression threshold, a maximum change threshold, a default minimal match length, and one or more of the respective locations as respective checkpoints;
wherein selecting the second minimal match length comprises setting the second minimal match length to a value greater than the first minimal match length upon detecting that the compression ratio is less than the low compression threshold.

* * * * *